US008521540B2

(12) United States Patent
Burns et al.

(10) Patent No.: US 8,521,540 B2
(45) Date of Patent: Aug. 27, 2013

(54) ENCODING AND/OR DECODING DIGITAL SIGNALS USING A PERMUTATION VALUE

(75) Inventors: Gregory Burns, Seattle, WA (US); Phillip Rutschman, Seattle, WA (US)

(73) Assignee: QUALCOMM Incorporated, San Diego, CA (US)

( * ) Notice: Subject to any disclaimer, the term of this patent is extended or adjusted under 35 U.S.C. 154(b) by 1016 days.

(21) Appl. No.: 11/840,880

(22) Filed: Aug. 17, 2007

(65) Prior Publication Data

US 2009/0048852 A1 Feb. 19, 2009

(51) Int. Cl.

*G10L 19/00* (2013.01)
*G10L 11/00* (2006.01)
*G10L 21/00* (2013.01)

(52) U.S. Cl.

USPC ............................ 704/500; 704/201; 704/200

(58) Field of Classification Search

None
See application file for complete search history.

(56) References Cited

U.S. PATENT DOCUMENTS 4,790,015 A * 12/1988 Callens et al. ................ 704/212
5,105,463 A 4/1992 Veldhuis et al.
5,379,351 A 1/1995 Fandrianto et al.
5,559,900 A 9/1996 Jayant et al.
5,703,579 A 12/1997 Nonaka et al.
6,456,968 B1 * 9/2002 Taniguchi et al. ............ 704/229
6,473,731 B2 * 10/2002 Hinderks ................... 704/200.1
6,487,535 B1 * 11/2002 Smyth et al. .................. 704/500
6,601,032 B1 * 7/2003 Surucu .......................... 704/500
7,027,982 B2 * 4/2006 Chen et al. .................... 704/230
7,155,383 B2 12/2006 Chen et al.
2003/0138046 A1 7/2003 Base et al.
2005/0226426 A1 * 10/2005 Oomen et al. .................. 381/23
2006/0050789 A1 3/2006 Gisquet et al.
2007/0011000 A1 * 1/2007 Liebchen ...................... 704/219
2007/0083362 A1 4/2007 Moriya et al.

FOREIGN PATENT DOCUMENTS

EP 1304885 4/2003
WO WO2008058754 5/2008

OTHER PUBLICATIONS

Pattichis et al. "On the Representation of Wideband Images Using Permutations for Lossless Coding". 4th IEEE Southwest Symposium on Image Analysis and Interpretation, 2000.*
Rice et al. "Adaptive Variable-Length Coding for Efficient Compression of Spacecraft Television Data". IEEE Transactions on Communication Technology, vol. Com-19, No. 6, Dec. 1971.*
Burrows M. and Wheeler D.J., "A Block-sorting Lossless Data Compression Algorithm", Technical Report 124, Digital Equipment Corporation, May 10, 1994.
Knuth, Donald, The Art of Computer Programming, vol. 2: Seminumerical Algorithms, Third Edition. Addison-Wesley, 1997. ISBN 0-201-89684-2, pp. 65-66, 77-78, 80-81, 91, 145-148, 154, 384, 460, and 679.

(Continued)

*Primary Examiner* — Jesse Pullias

(74) *Attorney, Agent, or Firm* — Micky Minhas; Espartaco Diaz Hidalgo

(57) ABSTRACT

Embodiments of methods, apparatuses, devices and systems associated with encoding and/or decoding audio data are disclosed. More particularly, the claimed subject matter relates, at least in part, to a data compression/decompression method or technique, such as a lossless, approximately lossless, and/or relatively lossless data compression/decompression method or technique, for example, along with systems or apparatuses that may relate to method or technique. The disclosed techniques and methods may achieve audio data compression ratios that may be comparable to lossless compression processes. In addition, under certain circumstances, such compression ratios may be achieved while also reducing or simplifying the computational complexity of the compression and/or decompression method or technique.

72 Claims, 8 Drawing Sheets

(56) References Cited

OTHER PUBLICATIONS

McCaffrey, James, "Using Permutations in .NET for Improved Systems Security", Aug. 2003, http://msdn2.microsoft.com/en-us/library/aa302371.aspx.

Jie Liang and Trac D. Tran, "Fast Multiplierless Approximations of the DCT With the Lifting Scheme", IEEE Transactions on Signal Processing, vol. 49, No. 12, Dec. 2001, pp. 3032-3044.

Zhongde Wang, "Fast Algorithms for the Discrete W Transform and for the Discrete Fourier Transform", IEEE Transactions on Acoustics, Speech, and Signal Processing, vol. 32, ASSP-32, No. 4, Aug. 1984, pp. 803-816.

Geiger, Ralf et al., "Audio Coding based on Integer Transforms", 111th AES Convention, Convention Paper #5471, Sep. 2001.

Supplementary European Search Report—EP07864169, Search Authority—Munich Patent Office, Jul. 30, 2010.

International Search Report and Written Opinion—PCT/US2007/84187, International Search Authority—European Patent Office—May 20, 2008.

Raad M et al: "Scalable audio coding employing sorted sinusoidal parameters" Signal Processing and Its Appications, Sixth International, Symposium on. Aug. 16-16, 2001, Piscataway, NJ, USA, I EEE, vol. 1, Aug. 13, 2001, pp. 174-177, XP010557211 ISBN: 978-0-7803-6703-6.

Taiwan Search Report—TW097131504—TIPO—Feb. 24, 2012.

* cited by examiner

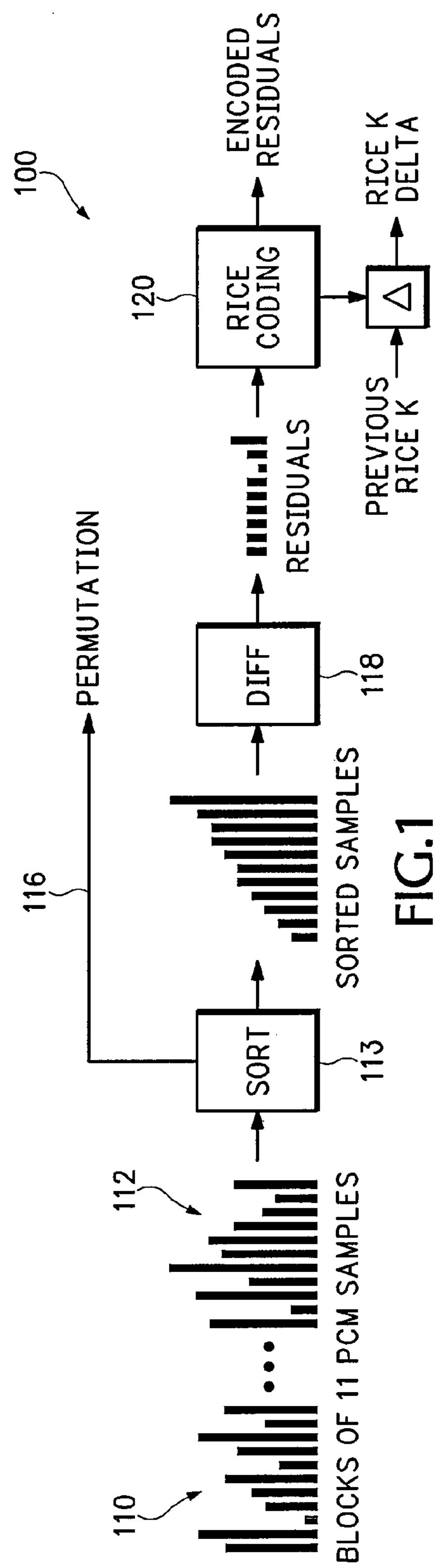
FIG.1
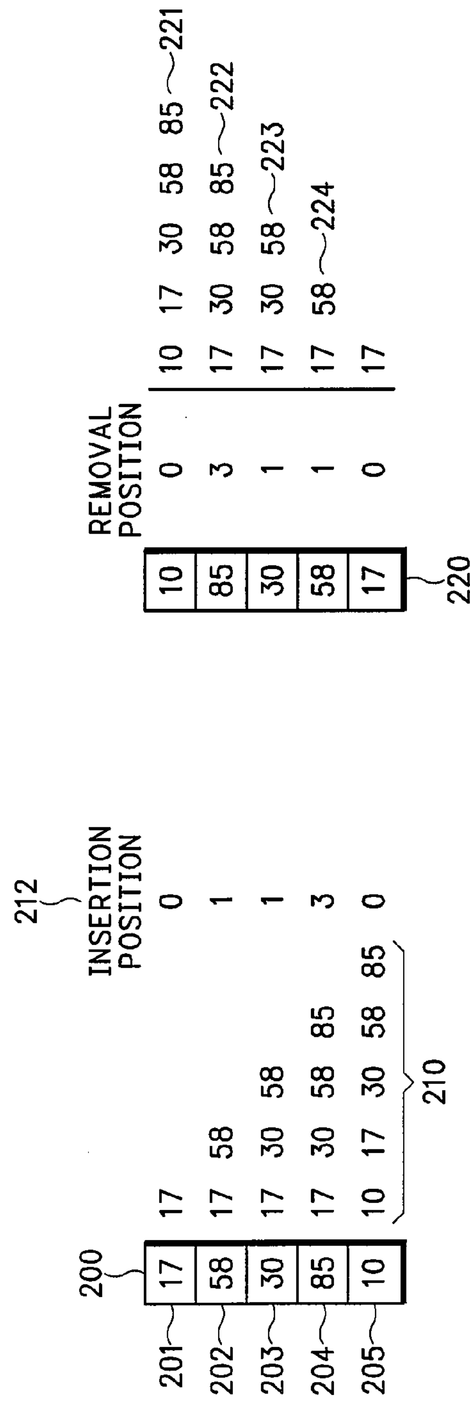
FIG.2A
FIG.2B

ENCODING AND/OR DECODING DIGITAL SIGNALS USING A PERMUTATION VALUE

FIELD

The present disclosure relates to the field of encoding and/or decoding digital content, such as encoding and/or decoding audio information that is represented by digital signals, for example.

BACKGROUND

In general, for various forms of digital content, including audio content, for example, lossless compression and/or decompression is desirable in a variety of circumstances. For example, such compression is desirable for transmission over a bandwidth limited communications channel or for storage in memory. Techniques for such compression and/or decompression continue to be sought, particularly techniques offering low latency and/or low computational complexity.

BRIEF DESCRIPTION OF DRAWINGS

Subject matter is particularly pointed out and distinctly claimed in the concluding portion of the specification. Claimed subject matter, however, both as to organization and method of operation, together with objects, features, and advantages thereof, may best be understood by reference of the following detailed description if read with the accompanying drawings in which:

FIG. 1 is a schematic diagram depicting an encoding method or technique in accordance with an embodiment;

FIG. 2A is a schematic diagram depicting a set of unsorted audio samples in accordance with one embodiment;

FIG. 2B is a schematic diagram depicting a set of sorted audio samples in accordance with one embodiment;

DETAILED DESCRIPTION

Figure 3:
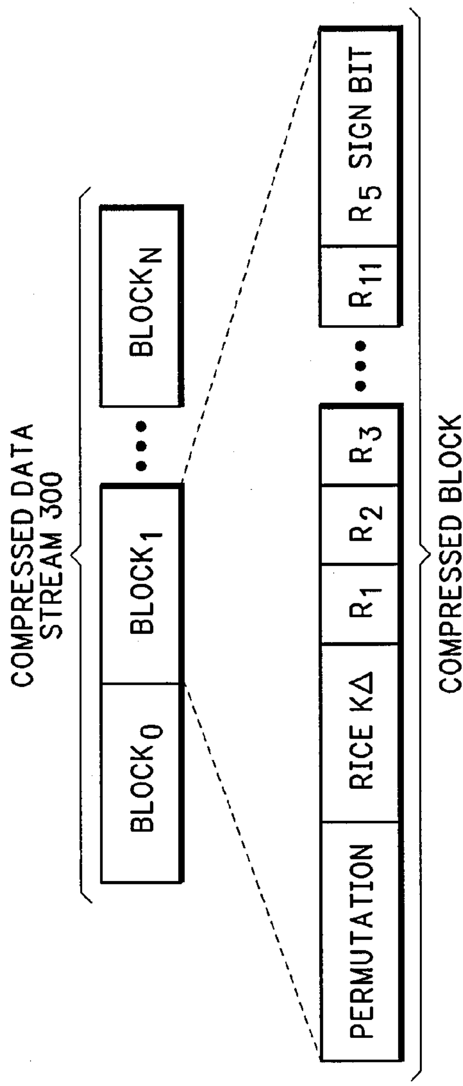
FIG. 3 is a schematic diagram depicted a compressed data stream in accordance with one embodiment.

In the following detailed description, numerous specific details are set forth to provide a thorough understanding of the claimed subject matter. However, it will be understood by those skilled in the art that the claimed subject matter may be practiced without these specific details. In other instances, methods, procedures, components and/or circuits that would be known by one of ordinary skill have not been described in detail so as not to obscure the claimed subject matter.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" and/or "an embodiment" in various places throughout this specification are not necessarily intended to refer to the same embodiment or to any one particular embodiment described. Furthermore, it is to be understood that particular features, structures, and/or characteristics described may be combined in various ways in one or more embodiments. In general, of course, these and other issues may vary with the particular context. Therefore, the particular context of the description and the usage of these terms may provide helpful guidance regarding inferences to be drawn for that particular context.

Likewise, the terms, "and," "or," and "and/or" as used herein may include a variety of meanings that will depend at least in part upon the context in which it is used. Typically, "and/or" if used to associate a list, such as A, B and/or C, is intended to mean A, B, or C as well as A, B and C. Though, it should be noted that this is merely an illustrative example and claimed subject matter is not limited to this example.

Unless specifically stated otherwise, throughout this specification, terms such as "processing," "computing," "calculating," "selecting," "forming," "enabling," "inhibiting," "identifying," "initiating," "querying," "obtaining," "hosting," "maintaining," "representing," "modifying," "receiving," "transmitting," "storing," "authenticating," "authorizing," "hosting," "determining" and/or the like refer to actions and/or processes that may be performed by a system, such as a computer and/or other computing platform, capable of manipulating and/or transforming data which may be represented as electronic, magnetic and/or other physical quantities within the system's processors, memories, registers, and/or other information storage, transmission, reception and/or display devices. Accordingly, a computing platform refers to a system or a device that includes the ability to process and/or store data in the form of signals or electronic data. Thus, a computing platform, in this context, may comprise hardware, software, firmware and/or any combination thereof. Further, unless specifically stated otherwise, a process as described herein, with reference to flow diagrams or otherwise, may also be executed and/or controlled, in whole or in part, by a computing platform.

Claimed subject matter relates, at least in part, to embodiments of a data compression/decompression method or technique, such as a lossless, approximately lossless, and/or relatively lossless data compression/decompression method or technique, for example, along with embodiments of systems or apparatuses that may relate to method or technique embodiments. For example, in certain circumstances, it may be desirable to achieve audio data compression ratios that may be comparable to state of the art lossless compression processes. In addition, under certain circumstances, it may be desirable to attain such compression ratios while also reducing or simplifying the computational complexity of the compression and/or decompression method. For example, in a portable device, battery life may be a relevant consideration, such that a compression scheme that achieves similar compression as other approaches but employs less processing power may be desirable to effectively extend the battery life of the device and/or improve one or more other performance characteristics of the device while also satisfactorily addressing bandwidth constraints that may be associated with the device. As an additional example, lower computational complexity may also be desirable for reducing latency associated with transmitting and receiving compressed audio data. In this context, the term audio data refers to audio information represented in the form of digital signals. Of course, the foregoing are merely illustrative examples of features that may be desirable in connection with compression and/or decompression processes; however, claimed subject matter is not limited in this regard.

FIG. 1 depicts a schematic diagram of an embodiment 100 of an encoding system, such as a system to encode audio data, although claimed subject matter is not necessarily limited in scope to encoding audio data. For example, image data, video data and other forms of digital content may be encoded. In this context, the terms image data and video data are intended to refer to image or video information represented in the form of digital signals. With regard to FIG. 1, encoding system embodiment 100 may comprise a compression scheme operable to receive one or more consecutive Pulse-Code-Modulated (PCM) audio samples, such as one or more digital signal samples. As used herein an "audio sample" or "digital signal sample" may mean a digital signal and/or value corresponding to one or more aspects of audio data. For example, an audio sample may comprise a portion of a set or sequence of audio signals, such as digital signals samples, having a particular size, lasting for a particular amount of time, having a particular frequency range, or having one or more other particular characteristics. Though, of course, these are merely examples relating to audio samples and claimed subject matter is not limited in this regard. In this particular embodiment, for example, audio samples may be grouped into one or more blocks of data, such as blocks 110 and/or 112. As used herein, a "block" may mean one or more audio samples or digital signal samples organized into a group. For example, one or more audio signal samples may be organized into a block based at least in part on one or more characteristics of the one or more audio signals. Though, again, these are merely examples relating to audio samples and claimed subject matter is not limited in this regard.

As just one example, blocks 110 and/or 112 may comprise one or more consecutive audio samples, such as eleven consecutive audio samples, where, for example, each audio sample may have a particular number of bits prior to being compressed, although, of course, claimed subject matter is not limited in scope in this respect. While, this embodiment is describe in terms of eleven audio samples, smaller and/or larger block lengths may alternatively be used. Likewise, while for this particular embodiment audio samples of length 16 bits are employed, again, a greater number of bits or fewer number of bits may be employed. Furthermore, audio blocks 110 and/or 112 may, under some circumstances, comprise an even number of samples. Alternatively, under some circumstances, audio blocks 110 and/or 112 may comprise an odd number of samples. Accordingly, claimed subject matter should not be limited to any particular number of audio samples. Of course, using smaller or large blocks of samples may, under some circumstances, affect compression performance in any one of a number of ways. For example, a smaller block length may, under some circumstances, result in a decrease in compression. Alternatively, under some circumstances, a larger block length may result in increases in latency or computational complexity. In any event, these are merely examples relating to block length to clarify that claimed subject matter should not be limited to the examples provided or to any particular block length.

Again, referring to FIG. 1, PCM audio sample values may be represented as a series of signed integer values organized into one of more groups, such as blocks 110 and/or 112, for example. Depending at least in part upon the particular embodiment, the integer values may represent any one of a variety of characteristics of the audio sample. For example and without limitation, the values may represent the amplitude of the signal sample, in this example, an audio signal, at a given point in time. Thus, without limitation, the values in blocks 110 and/or 112 may, under some circumstances, be represented as a series of signed integer values grouped into blocks of 11 consecutive audio samples. In addition, the values in blocks 110 and/or 112 may, under some circumstances, be represented as a series of signed or unsigned fixed point or floating point numbers, for example, grouped into one or more blocks of consecutive audio samples. In this embodiment, encoding system embodiment 100 may be operable to sort the samples of blocks 110 and/or 112 into ascending order, such that successive audio samples in the sorted block have higher numerical values than the preceding audio sample. For example, encoding system embodiment 100 may comprise a sort module 113. Under some circumstances, sort module 113 may be operable to sort blocks of PCM audio samples 110 and/or 112 such that each block contains a sorted sequence of audio sample values 114. Although depicted as an ascending sort, sorted sequence of audio samples 114 may alternatively comprise differently arranged sorts, such as a descending sort, for example. As used herein the term "sort" may mean to arrange data consecutively based at least in part on one or more aspects associated with the data. For example, sorting one or more audio samples may comprise arranging the one or more audio samples based at least in part on a numerical value associated with the individual audio samples, where the numerical value represents a characteristic of the audio samples that may vary among the samples, such as, for example and without limitation, signal amplitude. It should, of course, be noted that these are merely illustrative examples relating to sorting audio values and that claimed subject matter is not limited in this regard.

In an embodiment, the sorting process may also generate a permutation value, depicted in FIG. 1 as value 116, wherein the permutation value may comprise information that may be used to restore the PCM audio digital signal sample values in blocks 110 and/or 112 to the order of the sample values prior to being sorted. As used herein a "permutation value" may mean information which may, at least in part, be indicative of an order of a set of sorted sample values prior to the sample values being sorted. Thus, a "permutation value," under some circumstances, may be used to return a set of sorted audio sample values to the order of the sample values prior to being sorted. In an embodiment, permutation value 116 may comprise a symbol which may be associated with a block of sorted data, and which may provide information to so that the block of sorted data may be restored to having the order that existed prior to being sorted. Typically, although not necessarily, a reorder process designed to, in effect, undo a sort may be part of a more general decoding process, as discussed more fully below. For example, without loss of generality, in an embodiment, a decoding process may employ a permutation value, at least in part, to restore the sorted sample values to their order prior to being sorted, illustrated in FIG. 1 as corresponding to blocks 110 and/or 112. Though, it should be noted that these are merely illustrative examples relating to a permutation value and that claimed subject matter is not limited in this regard.

In an embodiment, permutation value 116 may be computed at least in part contemporaneously and/or concurrently with sorting PCM audio digital signal sample values. By way of example, supposed unsorted sample values, associated with the sorted audio digital signal sample values in blocks 110 and/or 112, may be represented as the following:

{V0, V1, V2, . . . Vn}

In one embodiment of a sort process, a first value, V0, may be moved to any of n positions, a second value, V1, may be moved to any of n−1 positions, and so on for the set of values in a particular block. This results in a total of n! (n factorial) possible permutation values, each permutation value corresponding to a particular unique order out of all possible unique orders for the block of values.

A variety of ways are potentially available to encode a permutation value. Claimed subject matter is not limited in scope to any particular approach. Rather, any one of a variety of approaches may be employed and several examples are provided below. A permutation value may be encoded by encoding a move using conventional binary coding in ceil(log 2(p)) number of bits, where p is the number of possible values for a specific move. In an embodiment wherein a block of audio sample values comprise 11 audio sample values, this approach results in a permutation value that can be encoded in approximately in 4+4+4+3+3+3+3+2+2+1 bits, or 29 bits. As an alternative, it may be desirable to encode the permutation using a different scheme to produce a more compact result. For example, it may be desirable to encode the permutation in a few as log 2(n) bits, where n corresponds to the number of values in a block of audio sample values. For example, if n is equal to 11, it may, under some circumstances, be desirable to encode the permutation value in as few as 25.25 bits. Though, of course, these are merely illustrative examples relating to encoding a permutation value and claimed subject matter is in no way limited to this particular example.

Another possible technique for encoding the permutation value may involve the use of factoradics. In this embodiment, if a block of n audio sample values is sorted, as described in more detail below, in one particular embodiment, the moves of individual values may be numbered $M_0$ through $M_n$. In an example, employing a block length of 11, the individual movement may be numbered $M_0$ through $M_{10}$. For example, in this embodiment, the permutation value may be encoding according to the following formula:

$$\sum_{0 \ldots n} M_n * n!$$

In this example, the permutation value comprises the summation of individual movements multiplied by successively larger factorials. For example, assuming block 110 includes 11 values, the permutation value 116 associated with sorted samples 114 may, under some circumstances, be encoded in approximately 26 bits. Though, again, this is merely an illustrative example relating to permutation values and claimed subject matter is not limited in this regard.

In an embodiment employing an insertion sort process, encoding a permutation value may occur concurrently with the sort process, as described below. Although, of course, claimed subject matter is not limited in scope to employing an insertion sort process. Any sorting process may, of course, be employed. However, in an embodiment, for example, as suggested above, employing an insertion sort, a sort module 113 may process a block of audio sample values, such as block 110, and produce a set of sorted sample values, such as sorted sample values 114, concurrently with permutation encoding 116. Without loss of generality, a specific example is discussed below for purposes of illustration.

FIG. 2A is a schematic diagram depicting a sorting process for a set of unsorted audio samples 200 in accordance with an embodiment. In this embodiment, again, the sort process comprises an insertion sort. For example, an insertion sort may build a set of sorted values by taking successive values from the set of unsorted values and determining where to insert a particular value in the set of sorted sample values. In this embodiment, the set of sorted sample values is initially empty so the first value is inserted at position 0, if using zero-based indexing. In this embodiment, the next value from the set of unsorted values may be inserted at either position 0 or position 1. In addition, a third value from the set of unsorted values may be inserted at position 0, position 1, or position 2. The sort process may continue until all values from the set of unsorted values have been inserted into a position. In this embodiment, values on either side of a point at which a value is to be inserted are shifted to the left or to the right to make room for the subsequent value. Furthermore, a point to insert a particular value is selected, at least in part, so that the particular value is between the values on either side of the point at which the particular value is to be inserted. Accordingly, an output list may comprise a sorted set of values. In this embodiment, the permutation value may correspond to the series of locations at which values are inserted. For example, for a set of N audio sample values, there are N! different or unique insertion location combinations.

Referring again to FIG. 2A, in this embodiment, the sorting process begins with a first value 201 in the set of unsorted audio samples. In this example, the sort process generates a 0 insertion position for first value 201. The sorting process proceeds to a next value 202 and determines if the value is larger or smaller than first value 201. In this example, second value 202 is larger than first value 201 so it is inserted after first value 201 and assigned the insertion position of 1. The sort process proceeds through the subsequent values of unsorted audio sample values 200 and, for a value, determines an insertion position or location for that value based at least in part on a comparison of the values. Returning to our example, the process proceeds to a third value 203 and determines an insertion location. Here, it is larger than first value 201, but smaller than second value 202, for example. Therefore, third value 203 is inserted after first value 201 and before second value 202. Of course, again, this is merely an example and claimed subject matter is not limited in scope to this particular example in any way. The sort process further assigns an insertion position of 1 for third value 203. Again, referring to our example, the sort process proceeds to a fourth value 204. This value is larger than first value 201, second value 202, and third value 203. Accordingly, the sort process inserts fourth value 204 after second value 202 and assigns it an insertion position of 3. Finally, in our example, the sort process proceeds to fifth value 205. This value is smaller than first value 201 and the sort process inserts fifth value 205 in front of first value 201. Fifth value 205 is also assigned an insertion value of 0. In this embodiment, the sort process has now produced a sorted set of audio sample values 210 along with a permutation value 212, which, in an embodiment, comprises a set of insertion values. Though, of course, again, it should be noted that these are merely illustrative examples relating to a sort process and that claimed subject matter is not limited in this regard.

FIG. 2B is a schematic diagram depicting an unsorting or reordering process for restoring the sorted audio sample values to the order of the audio sample values prior to being sorted, referred to here as the initial order. Referring now to FIG. 2B, the reordering process uses permutation value 212 at least in part to restore the sorted audio sample values 200 to the initial order. In an embodiment, the reorder process can restore the audio sample values 200 to the initial order, at least in part, by reversing the order of the insertion values represented by permutation value 212. This results in a list of removal positions 220, which may be used to remove audio sample values from sorted audio sample values 210. As a value is removed, the values to the left or right are moved to close the gap. In the example shown in FIG. 2B, the first removal position is position 0. Accordingly, the reorder process removes the value at the 0 position from line 221 and places that value in the restored list. The next removal position in the list of removal points 220 is 3. Accordingly, the reorder process removes the value at the 3 position from line 222 and places that value in the next position of restored list 220. The next removal position is 1, which results in the reorder process removing the value in the 1 position from line 223 and placing that value in the next position of restored list 220. The next removal point is again 1, and accordingly, the reorder process removes the values from the 1 position of line 224 and places it in the next position in restored list 220. Finally, the last removal position is 0, and the reorder process places the remaining value from the 0 position in the next position in restored list 220. Though, it should be noted that these are merely illustrative examples relating to a reorder process and that claimed subject matter should not be limited in this regard.

In this particular embodiment, the removal positions may be determined by performing one or more operations to decode the permutation value. For example, if the permutation value was encoded using factoradics, the removal positions may be determined by dividing the permutation value by successively smaller factorials. In a case in which a set of sorted digital signal sample values includes n values, the first removal position may be determined by dividing the permutation value by n!. The second removal position may be determined by dividing the remainder of the first calculation by n−1!. Subsequent removal positions may likewise be determined by dividing the remainder from the previous calculation by successively smaller factorials until all removal positions have been determined. Alternatively, in an embodiment, instead of division a multiplication process may be used. For example, a scale approximation of the permutation value may be multiplied by 1/N!. This value may then be right shifted to determine the first removal point. However, due to rounding errors this process may, under some circumstances, generate a removal point value that is one larger than the correct value. An error of this type may be detected by multiplying the determined removal point value by the appropriate factorial value, such as N! for the first removal point, and verifying that the product is not larger than the permutation value. If the product is larger than the permutation value, reducing the determined removal point value by one yields the correct value for the particular removal point. A similar multiplication and verification process may likewise be used to determine subsequent removal points. For a more specific example, in the case where there are 11 values in the set of sorted digital signal sample values, the first removal position may be determined by dividing the permutation value by 11!. The second removal position may be determined by dividing the remainder from the first calculation by 11−1!, and so on until all removal positions have been determined. Though, of course, it should be noted that these are merely illustrative examples relating to a reordering process and claimed subject matter is not limited in this regard.

Returning again to FIG. 1, encoding system 100 may further include a difference module 118. Difference module 118 may comprise one or more processes capable of operating on sorted value 114 at least in part to produce or compute a set of residuals or deltas representing a difference between adjacent values of the set of sorted values 114. For example, encoding system 100 may determine a value of the sequence, termed here the initial value, to which all other values are determined to be relative. This initial value could be any of the values in the block or sequence of sorted values, such as a first value in the sequence, a last value in the sequence or a middle value in the sequence. In this example, difference module 118 may then determine or compute a difference between the initial value and an adjacent value to produce a residual value corresponding to the adjacent value. Difference module 118 may then determine or compute a difference between the adjacent value and a next adjacent value to produce a residual value corresponding to the next adjacent value. For example, the initial value may comprise a middle value and difference module 118 may calculate the difference between the initial value and the first value to the left of the initial value. The difference module may then calculate a difference between the first value to the left of the initial value and the next adjacent value to its left. Likewise, difference module 118 may similarly calculate the differences between successive values to the right of the initial value. This process may continue until there is a residual value corresponding to each value to the left and to the right of the initial value. In a particular embodiment, the residual values may be represented as positive values by using the knowledge the values have been sorted or ordered so that they increase or decrease in value. Because the initial value may have a positive or negative value it may be desirable to encode a bit value representing the sign of the initial value. For example, in an embodiment in which the middle value of an odd number of values is employed as the initial value, whether the residual value is positive or negative may be accounted for by the relative position of the audio value that the residual value corresponds to and the initial value. For example, in an ascending sort, residuals representing a value to the left of the initial value would be known to have a lower value than the initial value so the negative of the calculated delta would not need to be encoded because the relative position conveys the positive or negative value associated with a residual value. Though, under some circumstances, it may be desirable to provide a mechanism indicating whether the initial value itself is a positive or negative value.

Figure 5:
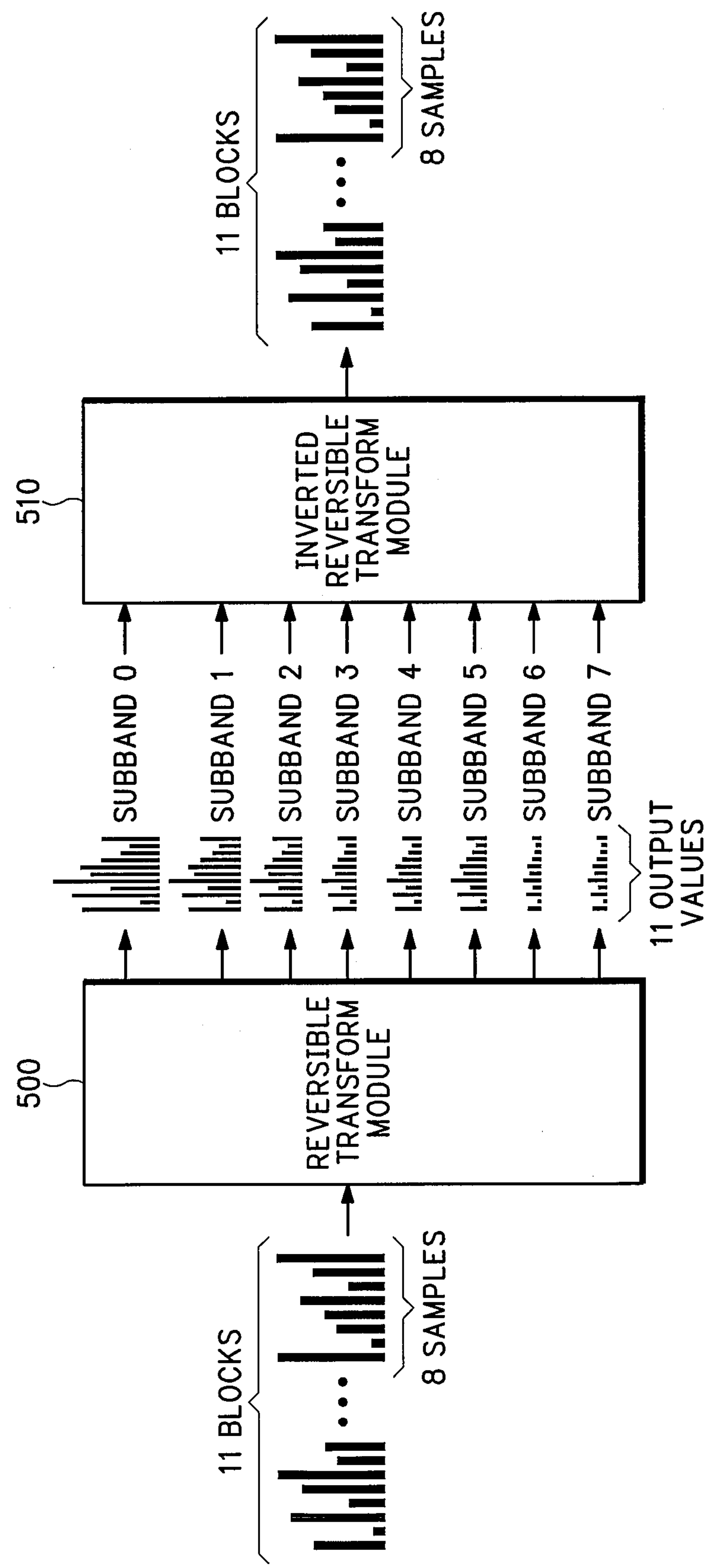
FIG. 5 is a schematic diagram depicting transforming one or more audio samples into two or more sub-bands in accordance with one embodiment.

It is noted that for the purposes of compression, there may be some advantages of applying a modified discrete cosine transform (MDCT) or similar process. FIG. 5 is a schematic diagram of encoding audio sample values into two or more sub-bands and restoring the audio sample values from the encoded sub-bands in accordance with one embodiment. In this embodiment, the blocks of audio sample values prior to the sorting process discussed above with regard to FIGS. 1 and 2A, may be partitioned into one or more equal or non-equal width frequency sub-bands. For example, encoding system 100 may further comprise a reversible transformation module 500. In this embodiment, the audio sample values may be operated on by reversible transformation module 500 to produce the two or more sub-bands. In the example depicted in FIG. 5, the audio sample values are partitioned into 8 sub-bands numbered 0 to 7, though, as discussed above other number of sub-bands may be used and claimed subject matter is accordingly not limited to the examples provided. For example, the encoding system may partition the samples into any number of sub-bands. While examples may include 4, 8, 16 or 32, the number can be odd or even and need not be a power of two, of course.

In one embodiment, reversible transformation module 500 may comprise an integer reversible Modified Discrete Cosine Transform (MDCT), described in more detail below. For further example, reversible transformation module 500 may comprise a wavelet transform, an Extended Lapped transform, and/or a Hierarchical Lapped transform. Though, it should be noted that these are merely illustrative examples relating to an encoding system and that claimed subject matter is not limited in this regard.

By way of example, a Modified Discrete Cosine Transform (MDCT) assumes periodic input signal samples to achieve desirable results, such as one or more optimal results, for example. However, in an embodiment, the sample values, such as PCM audio sample values, for example, are not necessarily periodic with respect to the MDCT input period. Thus, in an embodiment, as described in more detail below, it may desirable to include a windowing function, at least in part to address edge effects between blocks of sample values. Though, again, it should be noted that these are merely illustrative examples relating to an encoding system and that claimed subject matter is not limited in this regard.

It is also desirable that such a compression process be perfectly reversible or so-called integer reversible. Under some circumstances integer reversibility may be a requirement for implementing a lossless codec, for example. If a transform or process is integer reversible, errors that may occur due to the truncating effect of employing digital values of a finite length, such as 32 bits, for example, may be undone, which is a desirable feature. One advantage of a MDCT is its ability to be implemented using a series of matrices that are integer reversible, although claimed subject matter is not limited in scope in this respect. Many other transforms may be satisfactorily employed. However, because here, a modified MDCT, described in more detail below may be employed in an embodiment, an approach is illustrated for this particular embodiment in which operations to be implemented as part of the compression/decompression process are broken down into simpler operations so that one multiply-add per simple operation is performed, described in more detail below. Thus, for this particular embodiment, an implementation of the compression/decompression comprises a series of operations in which each operation is integer reversible.

This particular implementation of the MDCT may involve implementing various operations in the form of a rotation. However, rotation operations, such as may be implemented, for example, by rotation matrices, may be decomposed into simpler matrices in a manner suitable for implementation via integer arithmetic, thereby preserving integer invertability for implementation of the MDCT. As explained above, integer reversibility may be desirable for decoding in connection with implementation of a lossless codec. In this example, these matrices may be used to implement an efficient factorization of the MDCT, such as, a factorization of the MDCT into a windowing operation and a Type-IV DCT. Though, again, it should be noted that this is merely an illustrative example relating to a reversible transformation and that claimed subject matter is not limited in this regard.

In an embodiment, for example, a rotation matrix may be decomposed into a product of three matrices in accordance with relationship [1] as follows:

$$Rot_\theta \equiv \begin{bmatrix} \cos\theta & -\sin\theta \\ \sin\theta & \cos\theta \end{bmatrix} = \begin{bmatrix} 1 & a_\theta \\ 0 & 1 \end{bmatrix} \cdot \begin{bmatrix} 1 & 0 \\ b_\theta & 1 \end{bmatrix} \cdot \begin{bmatrix} 1 & a_\theta \\ 0 & 1 \end{bmatrix}$$

$$a_\theta \equiv \tan - \frac{\theta}{2},\ b \equiv \sin\theta$$

Without loss of generality, for the above equation $-\pi \leqq \theta < \pi$. If we introduce the following notation, we can define a series of integer reversible operations to implement a rotation, as suggested above. By way of example, in the following notation Q(x) refers to a quantization operator. One example may comprise a floor operator, which, under some circumstance, may be equal to the largest integer not exceeding the input value. By way of further example, in the following notation, x0 and x1 are integers.

$$Q\left(\begin{bmatrix} 1 & k \\ 0 & 1 \end{bmatrix} \cdot \begin{bmatrix} x_0 \\ x_1 \end{bmatrix}\right) = \begin{bmatrix} Q(x_0 + ax_1) \\ Q(x_1) \end{bmatrix}$$

$$= \begin{bmatrix} x_0 + Q(ax_1) \\ x_1 \end{bmatrix} \begin{bmatrix} x_0 + Q(ax_1) \\ x_1 \end{bmatrix} \Rightarrow x +$$

$$= Q(ax_1)$$

Therefore, using the notation above, the rotation of relationship [1] may be implemented in accordance with relationship [2] as follows:

$$x_0 += Q(a_\theta x_1)$$

$$x_1 += Q(b_\theta x_0)$$

$$x_0 += Q(a_\theta x_1)$$

Likewise, using this same notation, the rotation of rotation of relationship [2] may be inverted in accordance with relationship [3] as follows:

$$x_0 -= Q(a_\theta x_1)$$

$$x_1 -= Q(b_\theta x_0)$$

$$x_0 -= Q(a_\theta x_1)$$

For example, the first operation of relationship [3] above undoes the effect of the third operation of relationship [2], regardless of error introduced as a result of the finite length associated with digital computations, etc.

Permutations and negations are similarly integer invertible, as these operations may be accomplished by renaming variables and performing integer negation. Thus, an operation that may be represented as matrices factored into rotations, permutations, and negations is integer reversible, as desired.

For this embodiment, an MDCT is employed at least in part because a DCT is a periodic function, whereas a block of sample values is not periodic, as suggested previously. Thus, it is desirable apply a window function to an MDCT to smooth between blocks to account for this lack of periodicity. Likewise, one approach to windowing involves employing rotation operations. One advantage of employing such operations is that, as described above, they may be broken down into a series of integer reversible operations, as previously described.

Thus, windowing may comprise an operation involving a rotation between the second half of a block t−1 and the first half of block t, where t refers to the current block, in accordance with relationship [4] as follows, and where N is the number of sub-bands:

$$\begin{pmatrix} \tilde{x}_t(k) \\ \tilde{x}_{t-1}(N-1-k) \end{pmatrix} = \begin{pmatrix} w\left(\frac{N}{2}+k\right) & -w\left(\frac{N}{2}-1-k\right) \\ w\left(\frac{N}{2}-1-k\right) & w\left(\frac{N}{2}+k\right) \end{pmatrix} \begin{pmatrix} x_t\left(\frac{N}{2}+k\right) \\ x_t\left(\frac{N}{2}-1-k\right) \end{pmatrix}$$

$$\begin{pmatrix} \tilde{x}_t(k) \\ \tilde{x}_{t-1}(N-1-k) \end{pmatrix} = R_{\arctan\left(\frac{w\left(\frac{N}{2}-1-k\right)}{w\left(\frac{N}{2}+k\right)}\right)} \begin{pmatrix} x_t\left(\frac{N}{2}+k\right) \\ x_t\left(\frac{N}{2}-1-k\right) \end{pmatrix}$$

$$k = 0, \ldots, \frac{N}{2} - 1$$

Therefore, a windowed MDCT may, for example, be defined as follows:

$$X_t(m) = \sqrt{\frac{2}{N}} \sum_{k=0}^{2N-1} w(k) \cdot x_t(k) \cdot \cos\left(\frac{\pi}{4N}(2k+1+N)(2m+1)\right)$$

$$m = 0, \ldots, N-1$$

$X_t(m)$=transformed value of subband m for block t $w(k)$=windowing function $x(i)$=$i^{th}$ input sample prior to blocking $x_t(k)=x(t\cdot N+k)=k^{th}$ input sample of block t; 50% overlap The following relationships therefore describe this particular embodiment of an MDCT as a DCT-IV, preceded by a windowing operation implemented using the rotations of relationship [4], as follows:

$$X_k = \sqrt{\frac{2}{N}} \sum_{k=0}^{N-1} -\tilde{x}_t(N-1-k)\cos\left(\frac{\pi}{4N}(2k+1)(2m+1)\right)$$

$$\tilde{x}_{t-1}(N-1-k) = w\left(\frac{N}{2}-1-k\right)x_t\left(\frac{N}{2}+k\right) + w\left(\frac{N}{2}+k\right)x_t\left(\frac{N}{2}-1-k\right)$$

$$k = 0, \ldots, N$$

As a simplified example, using the rotations shown immediately above and N=4 may result in the following:

$$\begin{pmatrix} \tilde{x}_t(0) \\ \tilde{x}_{t-1}(3) \end{pmatrix} = R_{\arctan\left(\frac{w(1)}{w(2)}\right)} \begin{pmatrix} x_t(2) \\ x_t(1) \end{pmatrix}$$

$$\begin{pmatrix} \tilde{x}_t(1) \\ \tilde{x}_{t-1}(2) \end{pmatrix} = R_{\arctan\left(\frac{w(0)}{w(3)}\right)} \begin{pmatrix} x_t(3) \\ x_t(0) \end{pmatrix}$$

| $\theta$ | $a_\theta$ | $b_\theta$ |
|---|---|---|
| $\arctan\left(\frac{w(1)}{w(2)}\right) = \frac{3\pi}{16}$ | −.303346 | .555570 |
| $\arctan\left(\frac{w(0)}{w(3)}\right) = \frac{\pi}{16}$ | −.098491 | .195090 |

Thus, to implement this smoothing approach, it may be desirable to retain some sample values of the previous block, as indicated by the subscript t−1, in this example.

To implement an integer reversible DCT-IV, it is noted that a Wang factorization may be applied to obtain a decomposition of an N point DCT-IV matrix, $[C_N^{IV}]$, into a product of sparse matrices for which integer reversibility is possible and also is not computationally difficult to implement. As used herein, a "sparse matrix" may comprise any matrix in which a majority of the matrix entries are equal to 0. Though, it should be noted that these are merely illustrative examples relating to encoding digital samples and that claimed subject matter is not limited in this regard.

Returning to the encoding system of FIG. 1, encoding system 100 may further comprise a Rice coding module 120. In an embodiment, a particular block of data comprising delta values, other than an initial sample value, may be encoded using a Rice code, or an adaptive Rice code, for example. By way of example, a Rice code may comprise a parameterized run-length coding scheme that under some circumstances may provide desirable compression of data. For example, a Rice code may provide desirable compression if the number of small values in a data set exceeds or greatly exceeds the number of large values in the data set. One aspect which may affect the efficiency of a Rice coding scheme is the choice of a Rice encoding parameter k (Rice K). A Rice coding operation may be performed with a parameter K for a non-negative integer N, as follows: if, for example, S corresponds to the K least significant bits of N, and P corresponds to the integer quotient of N divided by 2K, rounded towards zero, then P may be encoded as unary code, for example by encoding P zeros in a row followed by a one, and S may be encoded as a binary code of length K. For example, if an inefficient K value is chosen, it is possible to end up with substantially large encoded values for a value being encoded. However, if an efficient K value is chosen, the encoded data should be smaller or more compressed than the values being encoded. In an embodiment, the K value used by encoding system 100 to encode an initial value and/or residual values will be provided to a decoding system (described below with regard to FIG. 5) for use in decoding the encoded data stream.

In at least one embodiment, a desirable K value may not vary greatly from one block of audio sample values to another block of audio sample values. For example, if encoding system embodiment 100 is operating on audio sample values corresponding to music, the K value may typically vary between one of a few values. Accordingly, it may, under some circumstance, not be necessary to actually provide the K value, again, referred to as the Rice encoding value, as part of the encoded signal sample values. For example, it may be advantageous to include a Rice K delta value along with the encoded signal samples, wherein the delta represents a difference between a current K value and the K value used for the previous block of encoded audio. Though, again, this is merely an illustrative example relating to encoding audio data and claimed subject matter is not limited in this regard.

In another possible embodiment, a desirable K value may be determined based at least in part on a magnitude of one or more residual values. For example, for a block of sample values having a maximum value of $x_{max}$, under some circumstances, a desirable K value may be limited according to the following:

$$1 + \left\lfloor \log 2\left(\left\lfloor \frac{x_{\max}-1}{2n+1} \right\rfloor\right) \right\rfloor \le k_{opt}(X) \le 1 + \left\lfloor \log 2\left(\left\lfloor \frac{x_{\max}-1}{3} \right\rfloor\right) \right\rfloor$$

Under some circumstance this may result in the desirable K value being limited to N, N+1, N+2, or N+3. In this embodiment, it may not be necessary to apply a bounded Rice code since, under most circumstances; the encoded residual value is expected to achieve compression. Likewise, if K* represents the K value chosen to perform the Rice coding, in some embodiments, it may be desirable to code selected residuals with K*+1. For example, in the embodiment describe above in which the middle value of a block is employed as the initial value, typically the variance in the residuals at the ends of the block is such that there may be a beneficial result if those values are Rice coded using K*+1, although, claimed subject matter is not limited in scope in this respect. Furthermore, for some embodiments, it may be desirable to compare the Rice encoded values of a sub-band to those values having been binary encoded to determine if binary coding provides better results. This could occur, for example, in situations involving audio signal samples, where silence is being coded, as an example. In this embodiment, a first sub-band of a block of audio sample values may be trial encoded with the K values indicated above. The K value yielding better compression may be used to encode additional sub-bands for a particular block of audio sample values that has been transformed into multiple sub-bands. Though, it should be noted that these are merely illustrative examples relating to encoding audio samples and that claimed subject matter is not limited in this regard.

FIG. 3 is a schematic diagram of a compressed data stream 300 in accordance with one embodiment. Referring now to FIG. 3, an individual block of data, such as Block 1 may comprise a variety of information. For example Block 1, may include a permutation value, a Rice k delta value, and a set of residual values, and a sign bit corresponding to a sign associated with the initial value of the audio samples. Though, it should be noted that this is merely an illustrative example relating to a compressed data stream and claimed subject matter is not limited in this regard.

Figure 4:
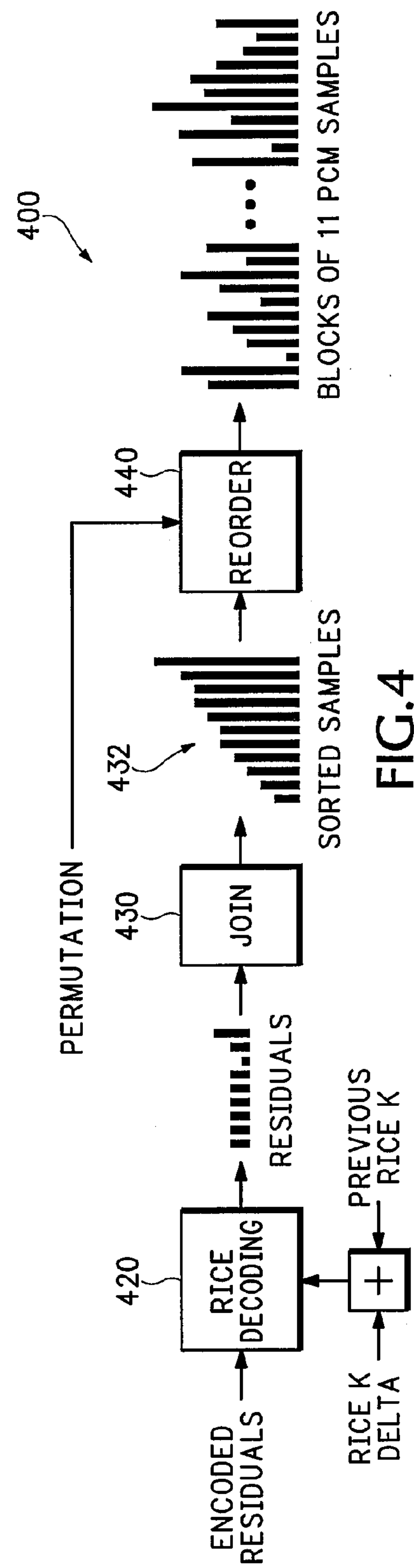
FIG. 4 is a schematic diagram depicting a decoding method or technique in accordance with one embodiment.

FIG. 4 is a schematic diagram of a decoding system 400 in accordance with one embodiment. Referring now to FIG. 4, decoding system embodiment 400 may receive a block of encoded and/or compressed data. For example, decoding system embodiment 400 may receive encoded data, such as one of the compressed blocks of data described with regard to FIG. 3. In an embodiment, decoding the encoded block of data may comprise essentially the inverse of the embodiments of an encoding method described above, though claimed subject matter is not limited in this regard. For example, decoding system embodiment 400 may receive a block of encoded data, wherein the block of encoded data includes a permutation value, a set of encoded residual values, a Rice k delta, and/or a sign bit corresponding to a sign of the initial value. In an embodiment, decoding system embodiment 400 may add the Rice k delta to a previous Rice K associated with a previous block of encoded data to determine a Rice K value associated with the current block of encoded data. Decoding system 400 may use the determined Rice K value to decode the set of encoded residual value, such as with Rice decoding module 420. It should, however, be noted that this is merely an illustrative example relating to decoding digital values and that claimed subject matter is not limited to this example.

Decoding system 400 may further comprise a join module 430. In an embodiment, join module 430 may reconstruct the sorted samples. For example, join module 430 may begin with the initial value. As discussed above, the initial value may correspond to a first value in the sorted set of values, a last value of a sorted set of values, or a middle value of the sorted set of values. In an embodiment where the encoding system employed an ascending sort, the initial value corresponds to the smallest value of the set of sorted values. In this example, join module 430 would add successive residual values in turn to reconstruct the sorted samples in ascending order. In another embodiment, the initial value may correspond to a central value of the sorted set of values. In this embodiment, join module 430 may add or subtract successive residual values, depending upon their location relative to the initial value, to reconstruct the sample values. In this embodiment, join module 430 may generate a sorted set of sample values 432. Though, it should be noted that these are merely illustrative examples relating to reconstructing sorted values and that claimed subject matter is not limited in these regard.

In an embodiment, decoding system 400 may further comprise a reorder module 440. Reorder module 440, may use the received permutation value at least in part to restore sorted set of sample 432 to their initial order or order prior to being sorted, such as by using an unsort method. For example, reorder module 440 may employ an unsorting scheme such as the scheme described above with regard to FIG. 2B. It should, of course, be noted that this is merely an illustrative example relating to decoding values and that claimed subject matter is not limited in this regard.

In an embodiment, the permutation value may be represented at least in part by employing factoradics. In this embodiment, the permutation value may be factored at least in part to generate the list of removal positions discussed above with regard to FIG. 2B. In one embodiment, the permutation value is factored by dividing the value by successfully smaller factorials to obtain a quotient and a remainder. For example, using a sample block size of 11, the encoded permutation value is first divided by 10!. In this embodiment, the quotient may be treated as the 10th removal position by reorder module 440. Decoding system embodiment 400 may now divide the remainder by 9!. The resulting quotient may be treated by reorder module 440 as the 9th removal position. Decoding system embodiment 400 may likewise divide the remainder from this operation by 8! to determine an 8th removal position and a remainder for use in determining a $7^{th}$ removal position. Decoding system embodiment 400 may continue dividing the remainder from the previous operations with successively smaller factorials to determine the removal positions for set of sorted value. Reorder module 430 may then use the set of removal positions, as described above, to reconstruct the initial order of the set of values. Though, again, it should be noted that this is merely an illustrative example relating to decoding values and that claimed subject matter is not limited in this regard.

Referring again to FIG. 5, in this example, reversible transform module 500 may generate, based on the received PCM audio samples, 8 separate blocks of data representing different frequency sub-bands. The blocks of frequency sub-band data may, in this embodiment, each include 11 values, though, or course, claimed subject matter is not limited to these examples. Under some circumstances, audio values representing music may include more energy in lower frequencies than in higher frequencies. As shown in FIG. 5, the higher numbered sub-bands, corresponding to higher frequency ranges may include smaller values than the lower numbered frequency sub-bands corresponding to lower frequency ranges. In these circumstances, the higher frequency sub-bands may be encoded using fewer bits than the lower frequency sub-bands. It should, however, be noted, that under some circumstances, it may be possible to generate output values that are larger that the input values. For example, under some circumstances, a 16 bit PCM input sample value after processing by an MDCT may generate output values as large as 19 bits. Though, of course, it should be noted that this is merely an illustrative example relating to encoding audio values and that claimed subject matter is not limited in this regard.

In this embodiment, sub-bands generated by reversible transform module 500 may be separately encoded, such as described above with regard to encoding system 100. For example, a sub-band may be encoded as described above without regard to the other sub-bands as an independent stream using an embodiment of a compression process, such as those described above, for example. The encoded data for the sub-bands may be interleaved in a stream of compressed data, as shown with regard to FIG. 6, in which the stream of compressed data comprises a series of frames with a frame including eight blocks and a block including eleven compressed values. Though, again, it should be noted that these are merely illustrative examples relating to encoding data and that claimed subject matter is not limited in this regard.

Referring again to FIG. 5, in this embodiment, the blocks of sub-band data, after the sorting process discussed above with regard to FIGS. 3 and 2B, may be used to recover the original audio sample values. For example, decoding system embodiment 300 may further comprise an inverted reversible transformation module 510. In this embodiment, the sub-band data may be operated on by inverted reversible transformation module 510 to produce the original audio data. In the example depicted in FIG. 5, blocks of data corresponding to the 8 sub-bands are shown, though, as discussed above, other numbers of sub-bands may be used and claimed subject matter is accordingly not limited to the examples provided. For example, the encoding system may partition the samples into any number of sub-bands, such as 4, 8, 16, or 32 sub-bands, for example, as previously discussed. In one embodiment, inverted reversible transformation module 510 may comprise an inverted fully integer reversible Modified Discrete Cosine Transform. In another embodiment, the audio sample values may be operated on by any of a number of other possible reversible transforms, such as a wavelet transform, an Extended Lapped Transform, and/or a Hierarchical Lapped Transform, for example. Referring again to FIG. 5, in one embodiment, 8 blocks of sub-band data may be received by inverted reversible transform module 510. In this example, inverted reversible transform module 510 may generate, based on the received 8 blocks of sub-band data, the original 8 PCM audio samples. Again, it should be noted that these are merely illustrative examples relating to encoding and/or decoding and that claimed subject matter is not limited in this regard.

Figure 6:
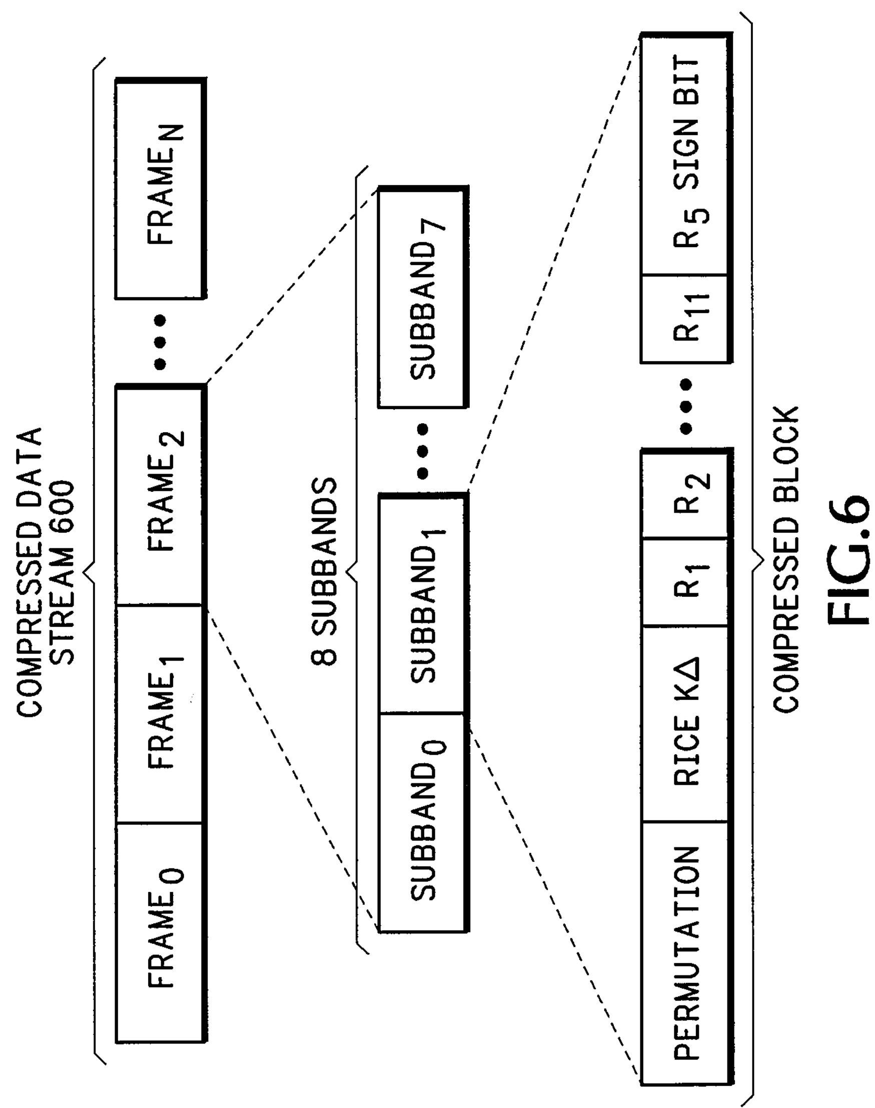
FIG. 6 is a schematic diagram depicting a compressed data stream in accordance with one embodiment.

FIG. 6 is a schematic diagram depicting a compressed data stream 600 in accordance with one embodiment. Referring to FIG. 6, compressed data stream 600 may comprise one or more data frames, such as $Frame_0$, $Frame_1$, $Frame_2$, up to $Frame_n$. As shown, with regard to an example frame, such as $Frame_2$, a frame comprises a block of data corresponding to the sub-bands generated by reversible transform 500. In this example, reversible transform module 500 generated 8 sub-bands, so a frame in the compressed data stream comprises 8 blocks of data corresponding to the 8 generated sub-bands. Though, again, it should be noted that any number of sub-bands may be used and that claimed subject matter is not limited to the examples provided. As shown in FIG. 6, with regard to an example block of sub-band data, corresponding to $sub\text{-}band_1$, a block of sub-band data may be encoded as described above with regard to encoding system embodiment 100. For example, a block of sub-band data may include a permutation value, a Rice K delta value, a set of residual values for a block of sub-band data, and a sign bit corresponding to an initial value of from the block of sub-band data.

In an embodiment, the compressed stream of data may be uncompressed using the decoding technique described above with regard to decoding system embodiment 400. For example, decoding system embodiment 400 may receive the compressed data. Based at least in part on the Rice K differential, decoding system embodiment 400 may determine a K value for decoding the residual values in a block of sub-band data. As noted above, for some embodiments, a value K+1 may be employed for residuals that may be expected to have higher variance, such as the residual values at the ends points of the block. Decoding system embodiment 400 may use the determined K value along with Rice decoding module 420 to determine the set of residuals for the block of sub-band data. In an embodiment, decoding system embodiment 400 may use the initial value and the residual values along with join module 430 to generate the sorted samples. In addition, decoding system embodiment 400 may generate the original sub-band data based at least in part on the generated sorted samples using reorder module 440. Once the original sub-band data has been recovered from the compressed stream of data, decoding system embodiment 400 may use inverted reversible decoding module 510 at least in part to reconstruct the original audio samples from the recovered sub-band data. Though, of course, these are merely illustrative examples relating to decoding data and claimed subject matter is not limited in this regard.

Figure 7A:
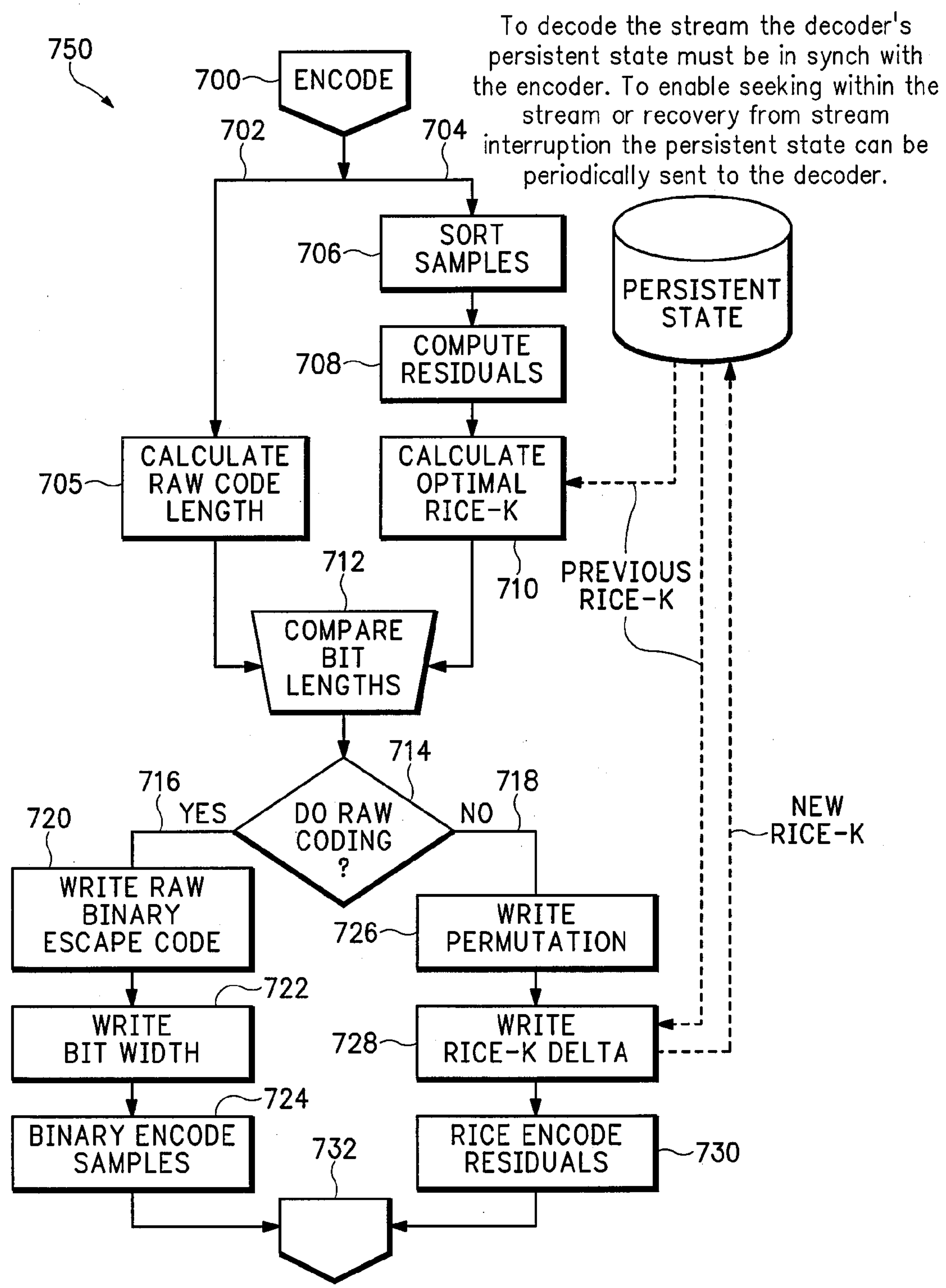
FIG. 7A is a flow chart depicting an encoding method or technique in accordance with one embodiment.

FIG. 7A depicts a flow chart of an encoding method 700 in accordance with an embodiment. With regard to box 700, encoding method 700 may initially include two possible path, path 702 and path 704. With regard to path 702 and box 705, encoding method 700 may calculate a raw code length, such as for binary encoding the sequence of PCM samples. With regard to path 704, encoding method embodiment 700 may also perform several operations on the sequence of PCM sample values. For example, referring to block 706, encoding method embodiment 700 may sort the sample values, such as using one of the sort techniques described above to produce a sorted set of sample values. The set of sorted samples may, for example, comprise a set of ascending sorted sample values or a set of descending sorted sample values. Furthermore, referring to block 708, encoding method embodiment 700 may compute a set of residuals for the sorted set of samples. For example, encoding method embodiment 700 may determine an initial sample value and calculate the difference between the initial sample value and adjacent samples positioned to the left and/or right of the initial sample value. As a further example, encoding method embodiment 700 may further calculate the difference between successive adjacent sample values to produce a set of residual values corresponding to the sorted set of sample value. Though, of course, it should be noted that these are merely illustrative examples relating to an encoding method and that claimed subject matter should not be limited in this regard.

Referring again to FIG. 7 and box 710 in particular, encoding method embodiment 700 may further calculate a desirable Rice K value for encoding the sorted set of sample value. For example, under some circumstances, encoding using a desirable Rice K value may provide marginal compression benefits. With regard to box 712, encoding method embodiment 700 may compare a bit length of binary encoded sample values to a bit length of those sample values encoded along path 704. Thus, encoding method embodiment 700 may determine if path 704 is providing compression relative to path 702 and whether or not to encode subsequent blocks of data, and/or other sub-bands following path 716 or path 718. Though, again, this is merely an illustrative example relating to encoding data and claimed subject matter is not limited in this regard.

With regard to block 714, encoding method embodiment 700 may determine whether to use the encoding from path 702 or the encoding from path 704. If for example, path 702 is applied then encoding method embodiment 700 may follow path 716. With regard to block 720, encoding method embodiment 700 may provide a code to indicate that binary coding is employed. For example, encoding method embodiment 700 may designate one or more bit sequences as a code to inform a decoding method embodiment that a subsequent block of data may be encoded as binary, rather than encoding using Rice encoding. Though, it should be noted that this is merely an illustrative example relating to an encoding method embodiment and claimed subject matter is not limited in this regard.

Referring now to box 722, encoding method embodiment 700 may now encode a bit width. In this embodiment, the bit width may comprise an indication as to how long the subsequent binary encoded data will be, for example. With regard to box 724, encoding method embodiment 700 may binary encode the audio sample values, such as for subsequent transmission. Though, it should be noted that these are merely illustrative examples relating to an encoding method.

If however, encoding method embodiment 700 determines that the audio sample values encoded along path 704 have a smaller bit length than the binary coded audio sample values from path 702, then encoding method embodiment 700 may proceed along path 718. With regard to box 726, encoding method embodiment 700 may provide a permutation value for the sorted set of sample values. With regard to box 728, encoding method embodiment 700 may provide a Rice K value, or a Rice K delta. With regard to box 730, encoding method embodiment 700 may Rice encode the computed residual values. Regardless of which path is chosen by encoding method embodiment 700, after the audio samples have been encoded along either path, encoding method embodiment 700 may then prepare the encoded audio samples for transmission or storage at box 732, for example, depending on the particular embodiment. Though, again, it should be noted that these are merely illustrative examples relating to an encoding method and that claimed subject matter is not limited in this regard.

As shown, in FIG. 7A, and as discussed above, subsequent blocks of audio sample values may be encoded based, at least in part based on a previously encoded block of audio sample values. For example, at box 710, encoding method embodiment 700 may calculate a desirable Rice K value based at least in part on a previous Rice K value, as shown in box 734. Furthermore, with regard to box 728, the Rice K delta may be determined by calculating a difference between the determined desirable Rice K value and the previous Rice K value. Though, again, these are merely illustrative examples relating to an encoding method and claimed subject matter is not limited in this regard.

Figure 7B:
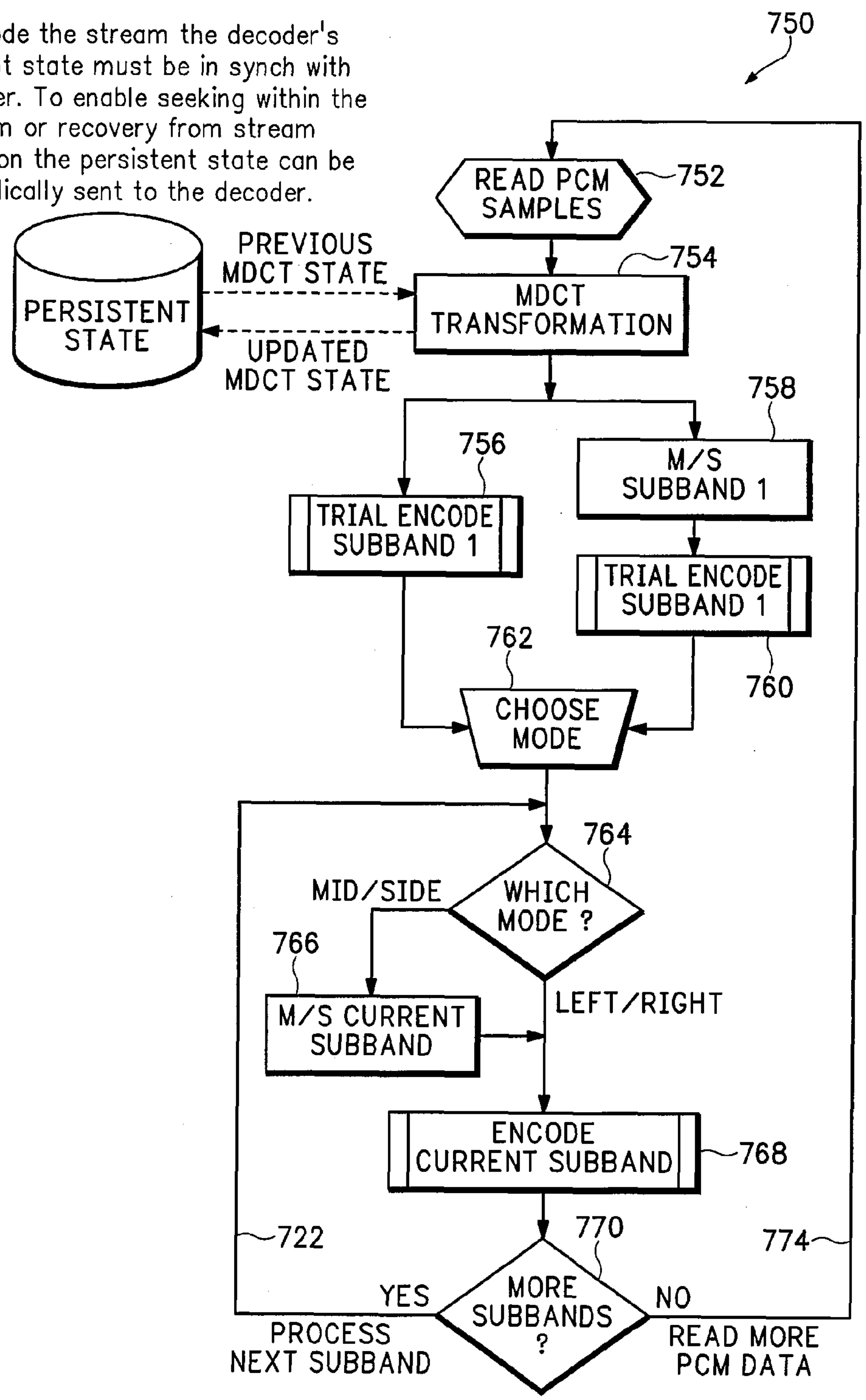
FIG. 7*b* is a flow chart depicting a multi-channel encoding method or technique in accordance with one embodiment.

FIG. 7B depicts a multi-channel encoding method 750 in accordance with an embodiment. With regard to FIG. 7B, under some circumstances multi-channel audio may be processed differently at least in part to increase compression. For example, if a one or more of the channels of the multi-channel audio are closely correlated, additional compression may be achieved under some circumstances by encoding one channel, at least in part, based on a second channel relative to the compression which may be achieved by encoding each channel separately. Under some circumstances, multi-channel audio may be encoded with the channels treated as separate input streams to the encoding method, system, or apparatus. However, under some circumstances, additional compression may be achieved, such as for stereo audio, if there is a relatively close correlation between the left and right channels, for example.

In one such embodiment, left and right channel audio data may be combined using a reversible "mid/side" vector rotation transformation, which, under some circumstances, may achieve a higher compression ratio than encoding the channels separately. Referring again to FIG. 7B, multi-channel encoding method embodiment 750 may read one or more audio sample values, such as PCM audio sample values at block 752. With regard to block 754, multi-channel encoding method 750 may perform a reversible transform on the audio samples, such as the modified DCT discussed above. With regard to box 756, multi-channel encoding method embodiment 750 may encode a trial sub-band of the audio sample values corresponding to both the left and right channels as independent data streams, as discussed above with regard to FIG. 7A. With regard to box 758, multi-channel encoding method embodiment 750 may also perform a mid/side vector rotation on the trial sub-bands corresponding to the left and right channels. With regard to box 760, multi-channel encoding method embodiment 750 may then trial encode the transformed sub-band. With regard to box 762, multi-channel encoding method embodiment 750 may then determine which of the trial encoded sub-bands has achieved a better compression ratio, and, based at least in part on this determination, decide how to encode that sub-band. Under some circumstances, trial encoding may be performed, as described above, for each sub-band. However, it may be computationally desirable to perform the trial encoding on a first sub-band. For example, if a first sub-band typically has more energy than the remaining sub-bands there may be a good probability that the remaining sub-bands will achieve similar compression ratios to the trial sub-bands. Under these circumstances, it may be desirable to encode the remaining sub-bands based on which approach achieved better compression in the trial sub-band. For example, if the trial encoded sub-band from box 756 was more compressed than the trial encoded sub-band from box 760, then multi-channel encoding method embodiment 750 may choose at box 764 to encode the remaining sub-bands with the same approach as used with regard to box 756 by proceeding to box 766. If, however, the trial encoded sub-band from box 760 was more compressed than the trial encoded sub-band from box 756, then multi-channel encoding method embodiment 750 may choose at box 764 to encode the remaining sub-bands with the same approach as used with regard to box 756 and proceed directly to box 768. With regard to box 770, multi-channel encoding method embodiment 750 may check to see if additional sub-bands remain for a particular block of data. If additional sub-bands remain then multi-channel encoding method embodiment 750 may proceed along path 772 and repeat the appropriate operations for encoding the remaining sub-bands. If, however, no additional sub-bands remain for a particular block of data, then multi-channel encoding method embodiment 750 may proceed along 774 and return to block 752 to begin encoding more blocks of PCM sample values. The decision to use left/right or mid/side may, under some circumstances, be made for every block of left and right channel audio sample values. It should, of course, be noted that these are merely illustrative examples relating to a multi-channel encoding method embodiment and that claimed subject matter is not limited in this regard.

Figure 8A:
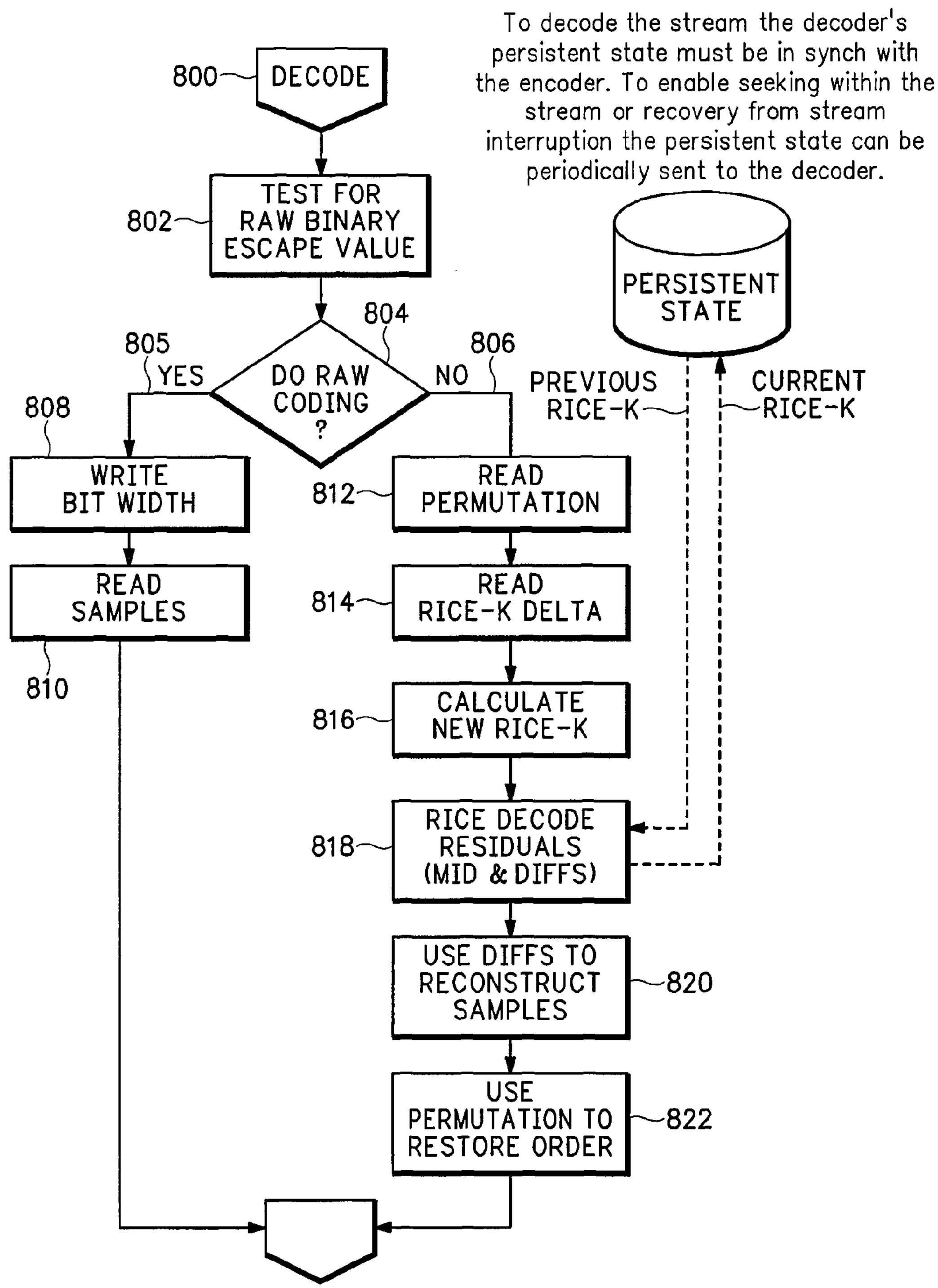
FIG. 8*a* is a flow chart depicting a decoding method or technique in accordance with one embodiment.

FIG. 8A, depicts a flowchart of a decoding method embodiment 800 in accordance with an embodiment. With regard to box 802, decoding method embodiment 800 may test received encoded audio sample values for binary code. If a binary code is detected, then decoding method embodiment 800 may determine at box 804 to proceed with binary decoding along path 805. If, however, a binary code is not detected, then decoding method embodiment 800 may determine at box 804 to proceed with MDCT decoding along path 806. With regard to path 805, decoding method embodiment 800 may process a bit width of the encoded audio at box 808. Decoding method embodiment 800 may then read the audio sample values at box 810. Though, it should be noted that these are merely illustrative example relating to a decoding method and that claimed subject matter is not limited in this regard.

With regard to path 806, decoding method embodiment 800 may at box 812 read a permutation value from the received encoded audio. With regard to box 814, decoding method embodiment 800 may read a Rice K value or a Rice K delta value from the received encoded audio. With regard box 816, decoding method embodiment 800 may calculate a Rice K value, based at least in part on a previous Rice K value and a received Rice K delta. With regard to box 818, decoding method embodiment 800 may Rice decode one or more residual values from the received encoded audio based at least in part on one or more encoded residual values and a determined Rice K value. With regard to box 820, decoding method embodiment 800 may use the decoded residual values to reconstruct a set of audio sample values, such as a set of sorted audio sample values. With regard to box 822, decoding method embodiment 800 may then use the permutation value from box 812, at least in part to restore an initial order to the set of ordered audio sample values, such as described above with regard to FIG. 2B. Though, it should be noted that these are merely illustrative examples relating to a decoding method embodiment and that claimed subject matter is not limited in this regard.

Figure 8B:
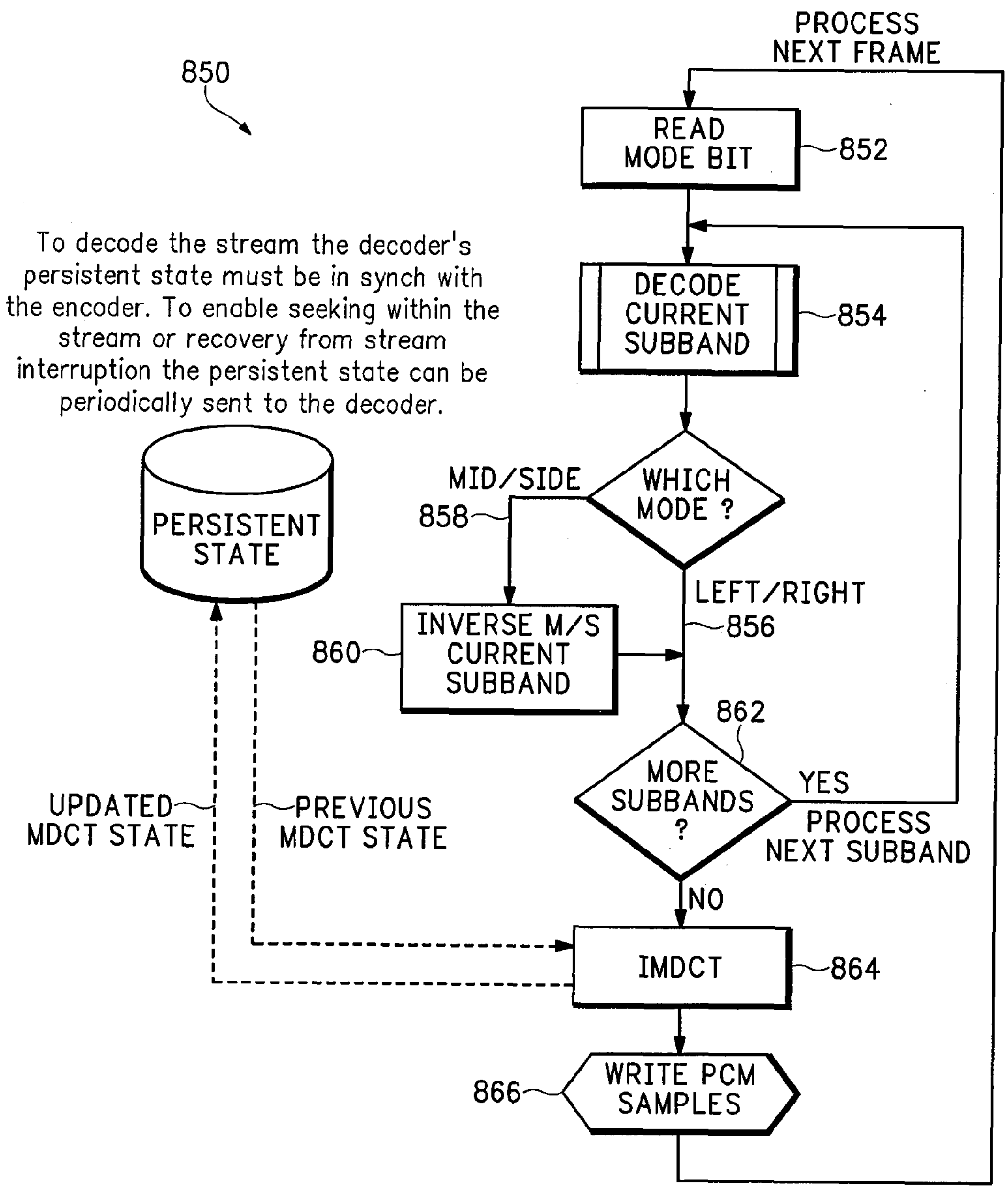
FIG. 8*b* is a flow chart depicting a multi-channel decoding method or technique in accordance with one embodiment.

FIG. 8B is a flow chart of a multi-channel decoding method embodiment 850 in accordance with an embodiment. In this embodiment, multi-channel decoding method embodiment 850 may receive encoded multi-channel audio. With regard to box 852, multi-channel decoding method embodiment 850 may read a mode bit from the received encoded multi-channel audio. In this embodiment, the mode bit may provide multi-channel decoding method embodiment 850 with information as to a mode in which received encoded multi-channel audio has been encoded. For example, the mode bit may inform multi-channel decoding method embodiment 850 whether the received encoded multi-channel audio was encoded with the channels as a separate data streams or whether the received encoded multi-channel audio was encoded with a mid/side conversion, as discussed above with regard to FIG. 7B. With regard to box 854, multi-channel decoding method embodiment 850 may proceed to decode a first sub-band of the encoded multi-channel audio. Multi-channel decoding method embodiment 850 may proceed along either path 856 or path 858, depending, at least in part, on the read mode bit from box 852.

If multi-channel decoding method embodiment 850 proceeds along path 858, then at box 860 multi-channel decoding method embodiment 850 will perform an inverse mid-side conversion on the current sub-band before proceeding to box 862. If multi-channel decoding method embodiment 850 proceeds along path 856, then it will proceed directly to box 862. With regard to box 862, multi-channel decoding method embodiment 850 will determine if there are additional sub-bands associated with the current sub-band. If there are additional sub-bands, then multi-channel decoding method embodiment 850 will return to box 852 and repeat the above process for additional sub-bands. If, however, there are no additional sub-bands, then multi-channel decoding method embodiment 850 will proceed to box 864. With regard to box 864, multi-channel decoding method embodiment 850 will perform an inverse reversible transform, such as the inverse modified DCT discussed above, on the sub-bands. With regard to box 866, multi-channel decoding method embodiment 850 will provide the restored PCM audio sample values for playback or for other processing, though, again, it should be noted that these are merely illustrative examples relating to a decoding method and that claimed subject matter is not limited in this regard.

In the preceding description, various aspects of claimed subject matter have been described. For purposes of explanation, specific numbers, systems and/or configurations were set forth to provide a thorough understanding of claimed subject matter. However, it should be apparent to one skilled in the art having the benefit of this disclosure that claimed subject matter may be practiced without the specific details. In other instances, features that would be understood by one or ordinary skill were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

The invention claimed is:

1. A method of compressing a sequence of digital signal samples comprising:

sorting the sequence of digital signal samples by magnitude;

computing differences between the sorted digital signal samples;

Rice encoding the differences; and representing the sequence using the Rice-encoded differences, the correct order of the digital signal samples, and at least one of the samples;

wherein when the sequence includes an odd number of digital signal samples then the at least one of the samples comprises a middle sample of the sequence sorted by magnitude, and wherein when the sequence includes an even number of digital signal samples then the at least one of the samples comprises at least one of two middle samples of the sequence by magnitude.

2. The method of claim 1, wherein sorting comprises sorting the sequence in ascending or descending order.

3. The method of claim 1, wherein the digital signal samples comprise audio digital signal samples.

4. The method of claim 3, wherein the audio digital signal samples comprise digital signal samples of music.

5. The method of claim 3, wherein the audio digital signal samples comprise pulse code modulated (PCM) digital signal samples.

6. The method of claim 1, and further comprising, prior to sorting, applying an integer reversible transformation to the digital signal samples at least in part to transform the digital signal samples into multiple frequency sub-bands.

7. The method of claim 6, wherein said integer reversible transformation comprises the modified discrete cosine transform (MDCT).

8. The method of claim 6, wherein the multiple frequency sub-bands comprise an even number of frequency sub-bands.

9. The method of claim 8, wherein the multiple frequency sub-bands comprise at least one of the following: 4, 8, 16, or 32 frequency sub-bands.

10. The method of claim 6, wherein the multiple frequency sub-bands comprise an odd number of frequency sub-bands.

11. The method of claim 1, wherein the correct order of the digital signal samples comprises a specific permutation of the digital signal samples encoded as a binary digital signal representation of a number.

12. The method of claim 1, wherein, for some sequences of binary digital samples, sequences in which binary digital encoding employs fewer bits than compression for the one or more sequences, the binary digital samples are binary digitally encoded rather than compressed.

13. The method of claim 1, and further comprising:

determining if encoding a first sorted sequence corresponding to a first channel of an audio file based on difference between the first sorted sequence and a second sorted sequence corresponding to a second channel of an audio file results in said first sorted sequence being expressed in fewer bits than the un-encoded first sorted sequence.

14. The method of claim 13, and further comprising:

under some circumstance, encoding said first sorted sequence based, at least in part, on one or more differences between the first sorted sequence and said second sorted sequence.

15. The method of claim 13, wherein said determining comprises:

encoding a first sub-band of said first sorted sequence; and comparing the encoded first sub-band to said first sub-band, at least in part to determine which comprises a smaller amount of data.

16. The method of claim 1, and further comprising decompressing a sequence of compressed digital signal samples as follows:

arranging the compressed binary digital signal samples in the correct order; and computing the binary digital samples from the differences and the at least one sample.

17. The method of claim 1, wherein representing includes:

representing the sequence using the Rice-encoded differences, a Rice K delta value indicating a difference between a Rice K value for a first block of audio samples and a Rice K value for a second block of audio samples, the correct order of the digital signal samples, and at least one of the samples.

18. A method of decompressing compressed audio data comprising:

arranging compressed binary digital signal samples in an order specified by an encoded permutation value; and computing decompressed binary digital samples by processing Rice-encoded binary digital sample differences and at least one full binary digital sample;

wherein when the order includes an odd number of digital signal samples then the at least one full binary digital sample comprises a middle sample of the order by magnitude, and wherein when the order includes an even number of digital signal samples then the at least one full binary digital sample comprises one of two middle samples of the order by magnitude.

19. The method of 18, wherein the digital signal samples comprise audio digital signal samples.

20. The method of claim 19, wherein the audio digital signal samples comprise digital signal samples of music.

21. The method of claim 20, wherein the audio digital signal samples comprise pulse code modulated (PCM) digital signal samples.

22. The method of claim 18, and further comprising, after computing the decompressed samples, applying an inverse modified discrete cosine transform (IMDCT).

23. The method of claim 22, wherein the IMDCT transforms multiple reconstructed frequency sub-bands into the original digital signal samples.

24. The method of claim 23, wherein the multiple frequency sub-bands comprise an even number of frequency sub-bands.

25. The method of claim 23, wherein the multiple frequency sub-bands comprise an odd number of frequency sub-bands.

26. The method of claim 18, wherein said encoded permutation comprises a binary digital representation of a number, said number representing a series of successive rearrangements within the order of the digital signal samples, wherein executing said series of successive rearrangements recovers the original sample order.

27. The method of claim 18, and further comprising:

if the order is binary digitally encoded, the order including signal information to indicate that it is binary digitally encoded.

28. A method of encoding audio data comprising:

applying an integer reversible transformation to sampled audio values to transform the sampled audio values into a plurality of frequency sub-bands, each frequency sub-bands including transformed audio values; and for each frequency sub-band:

sorting said transformed audio values according to magnitude;

selecting at least two transformed audio values from the sorted transformed audio values to comprise an initially selected value and a value adjacent to said initial selected value as a second selected value;

calculating a difference between said initially selected value and said second selected value;

calculating a difference between other adjacent values in the frequency sub-band; and packaging said initially selected value along with the calculated differences into a block of encoded audio data representing the frequency sub-band;

wherein when the transformed audio values include an odd number of transformed audio values then the initially selected value is a central value of the transformed audio values sorted by magnitude, and wherein when the transformed audio values include an even number of transformed audio values then the initially selected value is one of two central values of the transformed audio values sorted by magnitude.

29. The method of claim 28, and further comprising:

generating a permutation value, wherein said permutation value comprises information relating to the order of the transformed audio values prior to said sorting.

30. The method of claim 28, wherein said arranging the transformed audio values comprises arranging the sampled audio in ascending magnitude.

31. The method of claim 28, wherein said arranging the transformed audio values comprises arranging the sampled audio values in descending magnitude.

32. The method of claim 28, and further comprising:

applying a Modified Discrete Cosine Transform (MDCT) To said sampled audio values.

33. The method of claim 32, wherein the MDCT transforms the sampled audio values into multiple frequency sub-bands.

34. The method of claim 33, wherein the multiple frequency sub-bands comprise at least one of the following: 4, 8, 16, or 32 frequency sub-bands.

35. A method of decoding encoded audio data comprising:

receiving encoded frequency-transformed audio data for a plurality of frequency sub-bands;

for each frequency sub-band:

reconstructing frequency-transformed audio values of the sub-band based at least in part on a full frequency-transformed audio value and a set of frequency-transformed audio value differences included in the encoded frequency-transformed audio data; and arranging the reconstructed frequency-transformed audio values into the order of the frequency-transformed values of the sub-band prior to encoding; and applying an inverse integer reversible transformation to said arranged frequency-transformed audio values of the sub-bands to produce reconstructed sampled audio values;

wherein when the frequency-transformed audio values include an odd number of frequency-transformed audio values then the full frequency-transformed audio value is a central value of the frequency-transformed audio values sorted by magnitude, and wherein when the frequency-transformed audio values include an even number of frequency-transformed audio values then the full frequency-transformed audio value is one of two central values of the frequency-transformed audio values sorted by magnitude.

36. The method of claim 35, wherein said encoded audio data includes a permutation value; and wherein said arranging includes applying the permutation value to the reconstructed frequency-transformed audio values so as to arrange the reconstructed frequency-transformed audio values into the order of the sampled values prior to encoding.

37. The method of claim 36, wherein said permutation value comprises a binary digital representation of a number, said number corresponding to a sequence of moves of said frequency-transformed audio values.

38. The method of claim 35, and further comprising:

applying an inverse modified discrete cosign transform (IMDCT) To said encoded audio data.

39. The method of claim 38, wherein said IMDCT transforms multiple reconstructed frequency sub-bands into a set of original audio sample values.

40. The method of claim 39, wherein said multiple frequency sub-bands comprise at least one of the following: 4, 8, 16, or 32 frequency sub-bands.

41. The method of claim 35, wherein said reconstructed sampled audio values comprise pulse code modulated (PCM) digital audio samples.

42. An apparatus for decoding encoded audio data, said apparatus comprising:

a computing platform operable to receive encoded frequency-transformed audio data for a plurality of frequency sub-bands;

said computing platform further operable, for each frequency sub-band, to:

reconstruct frequency-transformed audio values of the sub-band based at least in part on a full frequency-transformed audio value and a set of frequency-transformed audio value differences included in the encoded frequency-transformed audio data; and arrange the reconstructed frequency-transformed audio values into the order of the frequency-transformed values of the sub-band prior to encoding; and said computing platform further operable to apply an inverse integer reversible transformation to said arranged frequency-transformed audio values of the sub-bands to produce reconstructed sampled audio values;

wherein when the frequency-transformed audio values include an odd number of frequency-transformed audio values then the full frequency-transformed audio value is a central value of the frequency-transformed audio values sorted by magnitude, and wherein when the frequency-transformed audio values include an even number of frequency-transformed audio values then the full frequency-transformed audio value is one of two central values of the frequency-transformed audio values sorted by magnitude.

43. The apparatus of claim 42, wherein said encoded audio data includes a permutation value; and wherein said computing platform is operable to apply the permutation value to the reconstructed frequency-transformed audio values so as to arrange the reconstructed frequency-transformed audio values into the order of the frequency-transformed values prior to encoding.

44. The apparatus of claim 43, wherein said permutation value comprises a binary digital representation of a number, said number corresponding to a sequence of moves of said frequency-transformed audio values.

45. The apparatus of claim 42, wherein said computing platform is further operable to apply an inverse modified discrete cosign transform (IMDCT) to said encoded audio data.

46. The apparatus of claim 45, wherein said IMDCT transforms multiple reconstructed frequency sub-bands into a set of original sampled audio values.

47. The apparatus of claim 46, wherein said multiple frequency sub-bands comprise at least one of the following: 4, 8, 16, or 32 frequency sub-bands.

48. The apparatus of claim 42, wherein said reconstructed sampled audio values comprise pulse code modulated (PCM) digital audio samples.

49. An apparatus for encoding a sequence of digital signal samples, said apparatus comprising:

a computing platform operable to sort the sequence of digital signal samples by magnitude;

said computing platform operable to compute differences between the sorted digital signal samples;

said computing platform operable to Rice encode the differences; and said computing platform operable to represent the sequence using the Rice-encoded differences, the correct order of the digital signal samples, and at least one of the samples;

wherein when the sequence includes an odd number of digital signal samples then the at least one of the samples comprises a middle sample of the sequence sorted by magnitude, and wherein when the sequence includes an even number of digital signal samples then the at least one of the samples comprises at least one of two middle samples of the sequence by magnitude.

50. The apparatus of claim 49, wherein said computing platform is operable to sort the sequence in ascending or descending order.

51. The apparatus of claim 49, wherein the digital signal samples comprise audio digital signal samples.

52. The apparatus of claim 51, wherein the audio digital signal samples comprise digital signal samples of music.

53. The apparatus of claim 51, wherein the audio digital signal samples comprise pulse code modulated (PCM) digital signal samples.

54. The apparatus of claim 49, wherein said computing platform is further operable to, prior to sorting, applying an integer reversible transformation to the digital signal samples at least in part to transform the digital signal samples into multiple frequency sub-bands.

55. The apparatus of claim 54, wherein said integer reversible transformation comprises the modified discrete cosine transform (MDCT).

56. The apparatus of claim 49, wherein said computing platform is operable to represent the sequence using the Rice-encoded differences, a Rice K delta value indicating a difference between a Rice K value for a first block of audio samples and a Rice K value for a second block of audio samples, the correct order of the digital signal samples, and at least one of the samples.

57. An article comprising: a non-transitory computer readable medium having stored thereon instructions, wherein said instructions if executed result in the following method:

arranging compressed binary digital signal samples in an order specified by an encoded permutation value; and computing decompressed binary digital samples by processing Rice-encoded binary digital sample differences and at least one full binary digital sample;

wherein when the order includes an odd number of digital signal samples then the at least one full binary digital sample comprises a middle sample of the order by magnitude, and wherein when the order includes an even number of digital signal samples then the at least one full binary digital sample comprises one of two middle samples of the order by magnitude.

58. The article of claim 57, wherein the digital signal samples comprise audio digital signal samples.

59. The article of claim 58, wherein the audio digital signal samples comprise digital signal samples of music.

60. The article of claim 59, wherein the audio digital signal samples comprise pulse code modulated (PCM) digital signal samples.

61. The article of claim 57, wherein said instruction if executed further result in, after computing the decompressed samples, applying an inverse modified discrete cosine transform (IMDCT).

62. The article of claim 61, wherein the IMDCT transforms multiple reconstructed frequency sub-bands into the original digital signal samples.

63. The article of claim 57, wherein said encoded permutation comprises a binary digital representation of a number, said number representing a series of successive rearrangements within the order of the digital signal samples, wherein executing said series of successive rearrangements recovers the original sample order.

64. An article comprising: a non-transitory computer readable medium having stored thereon instructions, wherein said instructions if executed result in the following method:

sorting a sequence of digital signal samples by magnitude;

computing differences between the sorted digital signal samples;

Rice encoding the differences; and representing the sequence using the Rice-encoded differences, the correct order of the digital signal samples, and at least one of the samples;

wherein when the sequence includes an odd number of digital signal samples then the at least one of the samples comprises a middle sample of the sequence sorted by magnitude, and wherein when the sequence includes an even number of digital signal samples then the at least one of the samples comprises at least one of two middle samples of the sequence by magnitude.

65. The article of claim 64, wherein sorting comprises sorting the sequence in ascending or descending order.

66. The article of claim 64, wherein the digital signal samples comprise audio digital signal samples.

67. The article of claim 66, wherein the audio digital signal samples comprise pulse code modulated (PCM) digital signal samples.

68. The article of claim 64, wherein said instructions if executed further result in, prior to sorting, applying an integer reversible transformation to the digital signal samples at least in part to transform the digital signal samples into multiple frequency sub-bands.

69. The article of claim 68, wherein said integer reversible transformation comprises the modified discrete cosine transform (MDCT).

70. An apparatus for encoding a sequence of digital signal samples, said apparatus comprising:

means for sorting the sequence of digital signal samples by magnitude;

means for computing differences between the sorted digital signal samples;

means for Rice encoding the differences; and means for representing the sequence using Rice-encoded differences, the correct order of the digital signal samples, and at least one of the samples;

wherein when the sequence includes an odd number of digital signal samples then the at least one of the samples comprises a middle sample of the sequence sorted by magnitude, and wherein when the sequence includes an even number of digital signal samples then the at least one of the samples comprises at least one of two middle samples of the sequence by magnitude.

71. The apparatus of claim 70, wherein the means for representing includes:

means for representing the sequence using the Rice-encoded differences, a Rice K delta value indicating a difference between a Rice K value for a first block of audio samples and a Rice K value for a second block of audio samples, the correct order of the digital signal samples, and at least one of the samples.

72. An apparatus for decoding encoded audio data, said apparatus comprising:

means for receiving encoded frequency-transformed audio data for a plurality of frequency sub-bands;

for each frequency sub-band:

means for reconstructing frequency-transformed audio values of the sub-band based at least in part on a full frequency-transformed audio value and a set of frequency-transformed audio value differences included in the encoded frequency-transformed audio data; and means for arranging the reconstructed frequency-transformed audio values into the order of the frequency-transformed values of the sub-band prior to encoding; and means for applying an inverse integer reversible transformation to said arranged frequency-transformed audio values of the sub-bands to produce reconstructed sampled audio values;

wherein when the frequency-transformed audio values include an odd number of frequency-transformed audio values then the full frequency-transformed audio value is a central value of the frequency-transformed audio values sorted by magnitude, and wherein when the frequency-transformed audio values include an even number of frequency-transformed audio values then the full frequency-transformed audio value is one of two central values of the frequency-transformed audio values sorted by magnitude.

* * * * *